United States Patent [19]

Van Rooij et al.

[11] 4,143,383
[45] Mar. 6, 1979

[54] CONTROLLABLE IMPEDANCE ATTENUATOR HAVING ALL CONNECTION CONTACTS ON ONE SIDE

[75] Inventors: Karel P. Van Rooij; Johannes T. Schrama; Adrianus W. Ludikhuize, all of Eindhoven, Netherlands

[73] Assignee: U.S. Philips Corporation, New York, N.Y.

[21] Appl. No.: 725,781

[22] Filed: Sep. 23, 1976

Related U.S. Application Data

[63] Continuation of Ser. No. 643,613, Dec. 22, 1975, abandoned, which is a continuation of Ser. No. 411,762, Nov. 1, 1973, abandoned.

[51] Int. Cl.² ............... H01L 29/92; H01L 29/72; H01L 29/12
[52] U.S. Cl. .................... 357/14; 357/13; 357/35; 357/58; 357/69; 307/221 D; 307/263
[58] Field of Search ............ 357/35, 36, 58, 69, 357/13, 14; 307/221, 263

[56] References Cited

U.S. PATENT DOCUMENTS

| | | | |
|---|---|---|---|
| 3,475,700 | 10/1969 | Ertel | 357/58 |
| 3,518,585 | 6/1970 | Wilcox | 357/58 |
| 3,549,960 | 12/1970 | Wedlock | 357/58 |
| 3,686,648 | 8/1972 | Matsushita | 357/58 |
| 3,714,473 | 1/1973 | Bartelink et al. | 357/58 |
| 3,747,201 | 7/1973 | Arai | 357/69 |
| 3,810,049 | 5/1974 | Krause | 357/58 |

Primary Examiner—Andrew J. James
Attorney, Agent, or Firm—Thomas A. Briody; Jack E. Haken

[57] ABSTRACT

A semiconductor device having two PIN-diodes arranged in series and in opposition, in which the semiconductor body comprises two surface zones of a first conductivity type which extend in a high-ohmic surface layer, said surface layer separating the surface zones from one another and from a low-ohmic region of the second conductivity type. The surface zones and the low-ohmic region are contacted at the same surface of the semiconductor body, preferably by means of beam leads. The device is particularly suitable for high frequency applications and may form part of an integrated circuit.

14 Claims, 4 Drawing Figures

CONTROLLABLE IMPEDANCE ATTENUATOR HAVING ALL CONNECTION CONTACTS ON ONE SIDE

This is a continuation of Ser. No. 643,613 filed Dec. 22, 1975, now abandoned, which was a continuation of Ser. No. 411,762 filed Nov. 1, 1973, now abandoned.

BACKGROUND OF THE INVENTION

The invention relates to a semiconductor device comprising two P,N−, N- or N, P−, P-diodes arranged in series and in opposition and having a semiconductor body with two relatively low-ohmic surface zones of one conductivity type which adjoin a substantially flat surface of the body and which extend in a relatively high-ohmic semiconductor surface layer which is common to the diodes, the high-ohmic layer extending from the surface farther into the semiconductor body than the surface zones and separating them from a low-ohmic region of the opposite conductively type, the low-ohmic region and the two surface zones being provided with an electrically conductive connection contact.

Such semiconductor devices are known, for example, from Electronics, Apr. 29, 1968, pp 75–79. In particular page 76 shows a number of embodiments of combinations of two P, N−, N- or N, P−, P-diodes hereinafter briefly referred to as PIN-diodes.

Many application possibilities exist for combinations of two PIN-diodes arranged in series and in opposition and they are in particular important also for circuits for high frequencies in the range of, for example, 10 MHz to 10 GHz and higher. They may be used as switches or controllable capacitors or, for example, in (electronically controllable) attenuators, phase shifting networks or modulators. These functions play an important part inter alia in electronic data methods, such as f.m. radio, television and radar.

As is known, the high frequency signal during operation is usually supplied to one of the two contacted surface zones, the other contacted surface zone forming the high frequency signal output. By means of the contacted low-ohmic region which is provided on the oppositely located side of the semiconductor body and which forms the center contact of the combination connected to the mode point of the two diodes, the two diodes are biased usually in the forward direction and sometimes in the reverse direction. In switches and attenuators, said bias may be obtained by means of direct current, while for this purpose, for example in modulators or ring-mixers, a low frequency alternating current signal in combination with a direct current is used. The fact is used that the differential resistance of the diodes is current-dependent in so far as direct current and comparatively slow current variations are concerned, but is substantially not influenced by or is at least much less sensitive to high frequency current variations.

The known diode combinations suffer from drawbacks notably from a point of view of manufacture. In connection with the required low series resistance in the forward direction, the surface zones on the one hand and the low-ohmic region on the other hand are present on oppositely located sides of the common high-ohmic semiconductor layer, as a result of which the semiconductor body has to be contacted on two sides. As a result of this, said devices are not suitable for use of direct contact methods in assembling. They cannot be provided with usual "beam leads" either, although as is known, connections in beam-lead form are advantageous at high frequencies due to their low inductance. Moreover, said devices are less suitable for use in integrated circuits. As a matter of fact, integration of high frequency circuits is attractive in particular if the electric connections between the circuit elements can be obtained in a simple manner and are relatively short so that the parasitic effects associated with said connections are considerably reduced. The said advantage can be realized to a restricted extent only with the known diode combinations.

By using the invention, the above-mentioned and other drawbacks can be mitigated entirely or at least partly.

SUMMARY OF THE INVENTION

It is the object of the invention to provide a new combination of PIN-diodes which are connected in series and in opposition, which combination is particularly suitable for use in high frequency applications and which furthermore can be manufactured in a comparatively simple manner. It is required, notably for high frequency applications, that inter alia the series resistance and inductances be very small. The invention is inter alia based on the recognition of the fact that the electrical properties and in particular also the high frequency properties are far less dependent on the low-ohmic region common to the diodes and the situation thereof relative to the surface zones than was assumed so far.

According to the invention, a semiconductor device of the type described in the preamble is characterized in that the low-ohmic region which has an electric connection contact adjoins the same surface as the two surface zones, the connection contact of one of the two surface zones forming a high-frequency signal input and the connection contact of the other surface zone forming a high-frequency signal output, a current path of controllable impedance being present between said signal input and signal output said current path extending substantially entirely in the semiconductor body so as to substantially bypass the connection contact of the low-ohmic region.

The high-ohmic surface layer preferably extends from the surface which the surface zones adjoin throughout the thickness of the semiconductor body down to an oppositely located surface which is substantially parallel to the said surface. The great advantage of this structure is that during the manufacture no doping at the oppositely located surface need be provided.

The resistivity of the high-ohmic layer is preferably larger than 50 Ω cm and better even larger than 100 Ω cm.

Viewed on the surface, the low-ohmic region which has a connection contact advantageously is present outside the part of the high-ohmic layer which is present between the two surface zones and in addition the distance between the low-ohmic region and each of the surface zones is larger than the distance between the facing edges of the two surface zones.

A further preferred embodiment of the diode combination according to the invention is characterized in that the two surface zones of one conductivity type and the low-ohmic region of the opposite conductivity type are contacted by means of connection contacts which are constructed in the form of conductors projecting laterally substantially parallel to the surface from the semiconductor body and generally termed beam leads.

An important advantage of the invention is that the diode combination can be used in integrated circuits. A further embodiment of the semiconductor device according to the invention is therefore characterized in that the semiconductor body forms part of a group of semiconductor bodies which each comprise one or more circuit elements and are formed from the same semiconductor slice by removing the excessive semiconductor material present between the said bodies and which are interconnected mechanically and electrically to form an integrated circuit by means of an insulating layer and/or an insulating support and/or by connection contacts.

BRIEF DESCRIPTION OF THE DRAWINGS

The invention will be described in greater detail hereinafter with reference to a few embodiments and the accompanying drawing, in which.

DESCRIPTION OF THE PREFERRED EMBODIMENTS

Figure 1:
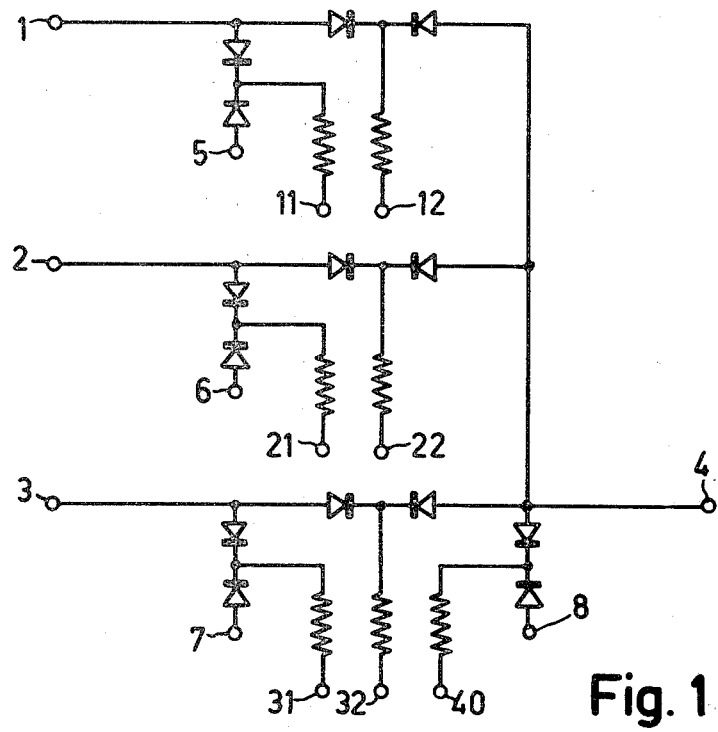
FIG. 1 is a circuit diagram of a 3-band-switch attenuator with PIN-diode combinations.

FIG. 1 is a circuit diagram of a 3-band-switch attenuator. This circuit which is composed of three controllable attenuation in $\pi$-arrangement comprises 7 combinations of two PIN-diodes connected in series and in opposition. The tree inputs of the three bands conventionally used in television techniques are denoted by reference numerals 1, 2 and 3, while the signal output is at 4. The center contacts of the diodes are connected, via resistors, to connection points 11, 12, 21, 22, 31, 32 and 40 which may be connected in turn, for example, to a control circuit not shown that can control, in accordance with a presented control signal, which of the alternating circuit signals presented to the inputs 1, 2 and 3 is transmitted to the output 4 and to what extent the transmitted signal is attenuated. The connections 5, 6, 7 and 8 can be connected to a point of reference potential, for example, earth.

Since the operation of the attenuator circuit and of the control circuit is of minor importance for the present invention, no further reference is made thereto. Of importance indeed is that these and similar circuits can be integrated by using the invention, in which the manufacture is proportionally simple and nevertheless circuits can be obtained having very good high frequency properties.

Figure 2:
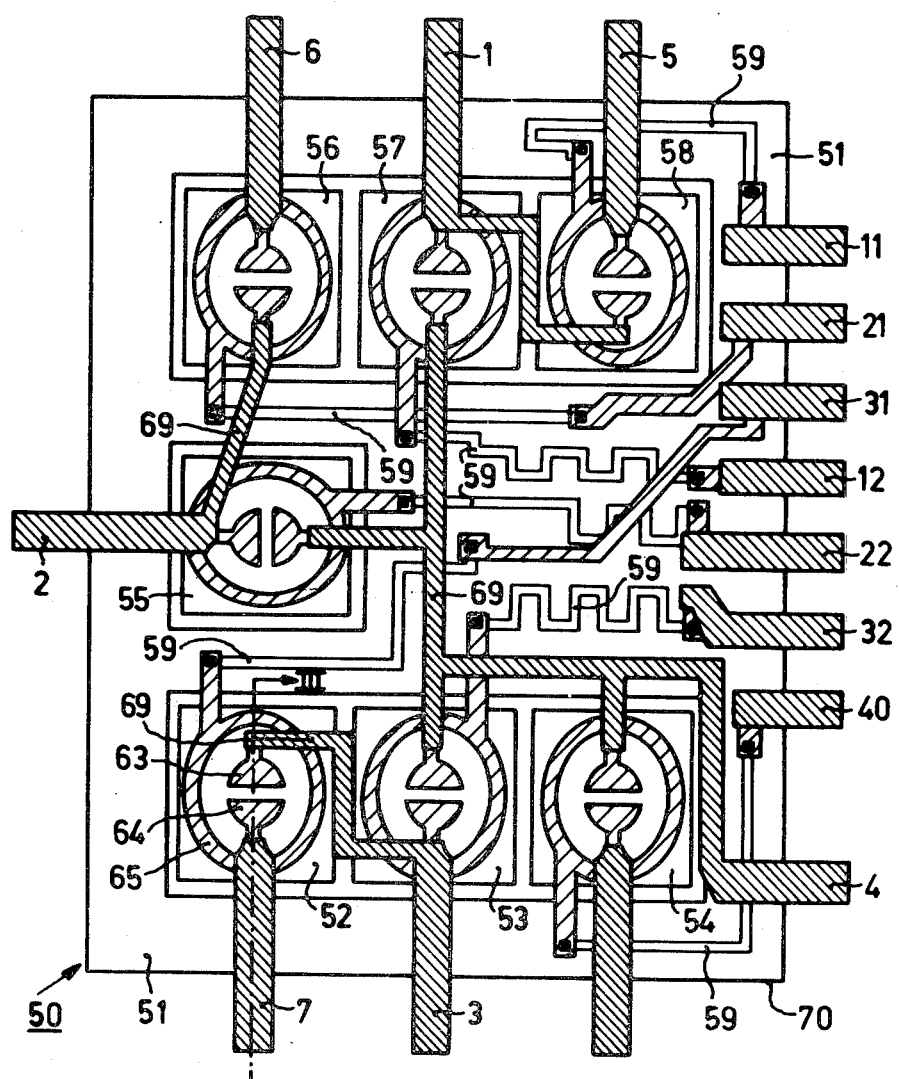
FIG. 2 is a diagrammatic plan view of an integrated circuit the associated circuit diagram of which is shown in FIG. 1.

FIG. 2, for example, shows diagrammatically the layout or topology of an integrated 3-band-switch/attenuator according to the diagram of FIG. 1, which integrated circuit turned out to be suitable in practice for use in the frequency range between 10 MHz and approximately 10 GHz, in which the attenuation can be controlled from approximately 0.5 to 60 dB and the resistance from a few ohms to about 5 k $\Omega$.

Corresponding electrical connection contacts in FIG. 2 are referred to by the same reference numerals as in FIG. 1.

The integrated circuit comprises a semiconductor body 50 having a number of sub-bodies or regions 51 to 58 which are insulated from each other. The region 51 surrounds the regions 52 to 58 and comprises the resistors shown in FIG. 1 in the form of seven doped semiconductor zones 59 of a conductivity type opposite to that of the region 51. Each of the seven regions 52 to 58 comprises two PIN-diodes arranged in series and in opposition as is shown in greater detail in the cross-sectional view shown in FIG. 3 which shows one of said diode combinations.

Said PIN-diode combination comprises a semiconductor body formed by the sub-body or region 52 which in this case consists of high-ohmic n-type silicon. The resistivity preferably is greater than 50 $\Omega$ cm or better greater than 100 $\Omega$ cm. This high-ohmic, at least proportionally substantially intrinsic region forms a common zone of the two PIN-diodes. Two juxtaposed surface zones 60 and 61 of a first conductivity type are present at a substantially flat surface 66 of said region 52. In this case surface zones 60 and 61 are p-type zones which have been obtained by ion implantation or diffusion and have a resistance per square of approximately 10 $\Omega$. They extend down to a depth of, for example, approximately 2 $\mu$m below the semiconductor surface, the thickness of the high-ohmic region 52 being much larger and, for example, approximately 40 $\mu$m.

The high-ohmic region 52 separates the surface zones 60 and 61 from each other and from a low-ohmic region 62 of the second conductivity type. The low-ohmic region 62 in this case is an n-type doped region having a resistance per square of, for example, approximately 2 to 3 $\Omega$. The surface zones 60 and 61 and the low-ohmic region are contacted by means of connection conductors or contacts 63, 64 and 65 which, according to the invention, are all three present at the same surface 66 of the region 52.

The connection conductors 63, 64 and 65 are conductor tracks which extend on an insulating layer 67 present on the semiconductor surface 66 and which contact the surface zones 60 and 61 and the low-ohmic region 62, respectively, through apertures in said layer 67.

Figure 3:
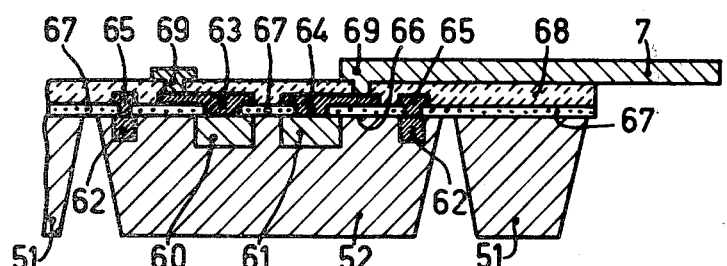
FIG. 3 is a diagrammatic cross-sectional view of a part of said integrated circuit taken on the line III—III of FIG. 2.

The diode combination described thus far with reference to FIG. 3 can be assembled in an envelope or in a hybrid circuit, in which conventional technologies may be used. For example, wires can be connected to the tracks 63, 64 and 65 by thermo-compression bonding or the tracks 63, 64 and 65 may be locally thickened so as to make the diode combination suitable for direct connection to a substrate having conductor tracks, the local thickening being connected, for example, by soldering to the conductor tracks of the substrate. The conductive connections 63, 64 and 65 may also be constructed in a conventional manner in the form of beam leads.

A possible embodiment of a beam lead connection, that is to say a connection formed by a conductor which projects from the semiconductor body in a lateral direction and approximately parallel to the surface of the semiconductor body at which contacted semiconductor surface zones are present, is shown in FIG. 3 as the connection 7. The contacted diode combination is covered with a second insulating layer 68 on which a second pattern of conductor tracks 69 is present. Parts of said second pattern of conductor tracks are connected, via apertures in the insulating layer 68, to conductors 63 and 64 present on the first insulating layer 67. All the conductor tracks 69 or a part thereof may be given a thickness which ensures a sufficiently large rigidity of the laterally projecting connection. The construction of beam leads used in this example is described in greater detail in British Pat. Specification No. 1,290,194. This construction is not only particularly suitable due to its great corrosion resistance, but also because a second layer of connection conductors is available so that simply crossing connections can be realized. Furthermore in the circuit shown in FIG. 2, particularly, those conductive connections in which series resistance and/or parasitic capacitance relative to the semiconductor body are annoying are provided in the second layer as much as possible. As a matter of fact, the conductor tracks in the second layer can easily be given a comparatively large cross-section, for example, by using a comparatively large thickness, and in addition the second layer is present at a larger distance from the semiconductor body than the first layer. For clarity, the conductor tracks of the first layer and those of the second layer are shaded in different directions in FIG. 2. It will furthermore be obvious that series resistance and parasitic capacitances often play an important part notably in high frequency circuits of the present type, in which they can restrict, for example, the admissible frequency range.

The described integrated circuit comprises a number of sub-bodies 51 to 58 which are manufactured from the same semiconductor slice and which are insulated from each other by the removal of the excessive semiconductor material. The sub-bodies are connected together mechanically by the insulating layers 67 and 68 which bridge the grooves present between the sub-bodies, by a part of the conductor tracks of the first layer, for example, conductor track 65, by a part of the conductor tracks 69 of the second layer, and by the connection conductors projecting partly from the edge 70. Of course, the said conductor tracks and connection conductors also form the electric connections necessary for the circuit.

Figure 4:
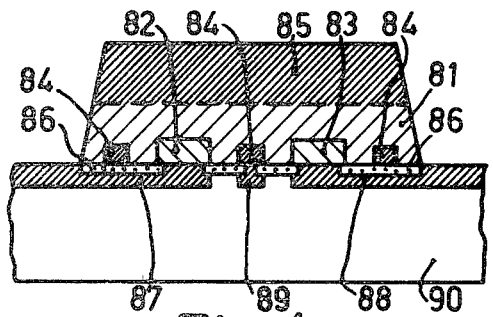
FIG. 4 is a diagrammatic cross-sectional view of a second embodiment of a PIN-diode combination according to the invention.

FIG. 4 shows another embodiment of the diode combination according to the invention. Two circular n-type surface zones 82 and 83 having a diameter of approximately 80 $\mu$m are present at a surface of a high-ohmic p-type semiconductor body 81. At the said surface said surface zones are surrounded at a certain distance by a low-ohmic p-type region 84. The region 84 is a continuous region having two circular apertures of a diameter of approximately 240 $\mu$m and in the centres of which the surface zones 82 and 83 are located. At the oppositely located surface of the semiconductor body 81 which is approximately 50 $\mu$m thick, a low-ohmic p-type layer 85 is provided.

The semiconductor body 81 furthermore comprises an insulating layer 86 having apertures through which conductor tracks 87, 88 and 89 are connected to the surface zones 82 and 83 and the low-ohmic region 84. When its contacted side, the semiconductor body is connected to an insulating support 90 on which, if desired, other semiconductor elements may also be present.

In manufacturing the diode combination shown in FIG. 4, starting material may be, for example, a p-type silicon slice having a resistivity of 200 to 300 $\Omega$ cm and a thickness of, for example, approximately 200 $\mu$m. The central part of said slice is etched to a thickness of, for example, approximately 50 $\mu$m, in which a circumferential edge is maintained with the original thickness in connection with the desired handleability of the slide in the further treatments. A low-ohmic, for example boron-doped p-type layer may then be provided on one or on both side of the slice, in which in the latter case the resulting layer on one side of the body is removed again, for example, by etching. The central part of the slice now consists of a low-ohmic layer 85 and a high-ohmic layer 81.

It is to be noted that for most applications a high-ohmic layer 81 having a very high resistivity and a long life time of the charge carriers is desired, so that said layer can in practice not readily be provided as an epitaxial layer. Starting material in this case must be a homogeneous body and after the semiconductor slice has been given substantially the desired thickness, doped regions must be provided on two different sides.

The surface regions 82, 83 and 84 can then be provided in the usual manner in the high-ohmic layer 81 and simultaneously zones of other circuit elements can be obtained elsewhere in the semiconductor slice. After having provided the semiconductor slice in the usual manner with conductor tracks 87, 88 and 89 for the mutual interconnection of circuit elements and/or for the electric connection of the device, the slice may be provided on an insulating support. The central part of the disc may then be subdivided into parts which are separated from each other by etching from the surface of the low-ohmic layer 85. The insulating support may then also be subdivided. The resulting support parts may have one or several semiconductor bodies. In the latter case, integrated circuits can be obtained which are held together mechanically mainly by the insulating support, the electric connections being formed by conductor tracks such as the tracks 87, 88 and 89.

So the diode combination can be manufactured in a comparatively simple manner in which the low-ohmic layer 85 need not be contacted because a center contact for the combination is provided on the oppositely located side. The fact is used that the center contact serves for the direct current adjustment only and the alternating current signal does not flow through said connection. The series resistance of said connection therefore has substantially no influence on the high frequency properties of the diode combination.

The low-ohmic layer 85 on the contrary may serve to reduce the series resistance for the alternating current flowing from the surface zone 82 to the surface zone 83 or conversely. Experiments performed in connection with the invention, however, have demonstrated that if said surface zones are not located at too large a distance from each other, the influence of the low-ohmic layer 85 on the series resistance is comparatively small. This fact may be used to considerably simplify the manufacture. Actually, by omitting the low-ohmic layer, such as in the example of FIG. 3, the thin etching of the semiconductor slice in an early stage and the doping thereof on both sides may be omitted. So the high-ohmic semiconductor layer preferably extends from the surface at which the surface zones are present throughout the thickness of the semiconductor body and to an oppositely located surface which is substantially parallel to the said surface, the part of the semiconductor body present below the surface and extending up to the oppositely located surface consisting entirely of high-ohmic material. The semiconductor slice is etched thin only after the desired doping and after the metallization have been provided and is usually subdivided subsequently.

The thin etching need in this case be carried out less accurately because the thickness of the slice has a smaller influence on the electrical properties than in the example shown in FIG. 4 in which the distance between the zones 82 and 83 and the low-ohmic region 85 depends upon the thickness and therefore also on said etching treatment.

As is known, the high-ohmic region in PIN-diodes is flooded during operation in the forward direction with charge carriers injected in said region, said charge carrier concentration which is high in proportion to the thermal equilibrium concentration in said region, determining the conductibility of the high-ohmic region. Said conductibility can be adjusted by means of direct current and/or be varied with an alternating current of not too high a frequency. When the alternating current frequency becomes too high, the concentration of injected charge carriers can no longer adapt sufficiently rapidly to the instantaneous current level and when the frequency is sufficiently high the high-ohmic region therefore behaves substantially as an alternating current-independent resistor. In the PIN-diode combination shown in FIG. 3 it must probably be assumed that the part of the high-ohmic layer 52 associated with each of the two diodes and which is flooded with charge carriers is so large that actually a continuous common region adjoining the two surface zones 60 and 61 and having a high concentration of injected charge carriers is formed. The direct current can then flow via said common region which forms a controllable resistor directly from one surface zone 60 to the other surface zone 61, or conversely. It could be explained in this manner that the location and the resistivity of the low-ohmic region 62 have substantially no and at least no decisive influence anymore on the high frequency series resistance of the diode combination. In this connection the conductivity type of the high-ohmic layer does not play an important part. The said layer may be both an n-type and a p-type layer.

Now that the alternating current can flow directly from one surface zone to the other, the surface zones are preferably facing each other with a substantially straight part of their boundary. At the surface the zones 60 and 61 have substantially the shape of half a circle (see FIG. 2), they being juxtaposed with the straight part of their edge facing each other. The radius of the circle is, for example, 40 $\mu$m and the straight part of the zone edge is, for example, 80 $\mu$m. The distance between the two surface zones is, for example, approximately 20 $\mu$m. The low-ohmic region 62 is preferably present outside the part of the high-ohmic layer 52 present between the two surface zones and may be constructed, for example, to be annular, at least with a closed geometry, as in FIGS. 2 and 3, or may consist of one or more regions which are preferably arranged symmetrically relative to the region occupied by the surface zones. In the example of FIG. 3 the distance between the inner boundary of the zone 62 and each of the surface zones 60 and 61 is approximately 40 $\mu$m. The outer boundary of the zone 62, is, for example, rectangular and has dimensions of approximately 200 $\mu$m × 220 $\mu$m. The smallest distance at the surface between each of the low-ohmic region(s) and each of the surface zones is preferably larger than the distance between the facing edges of the two surface zones.

It will be obvious that the invention is not restricted to the embodiments described but that many variations are possible to those skilled in the art without departing from the scope of the invention. For example, other semiconductive materials, such as germanium and $A_{III}B_V$-compounds, may be used. In addition to silicon oxide, for example, silicon nitride or aluminum oxide may be used as an insulating layer, composite insulating layers constructed from several layers being also suitable.

In the examples described, the conductivity types of the surface zones and the low-ohmic region may be interchanged. The surface zones, notably in the case of PIN-diodes which are operated in the forward direction, are preferably formed by n-type zones.

Inter alia, if the diode combination is used as a variable capacitance, the conductivity type of the high-ohmic layer is advantageously equal to that of the low-ohmic region and hence opposite to that of the two surface zones. Furthermore, notably with variable capacitances, the high-ohmic surface layer may be an epitaxial layer having a doping profile which is adapted to said application and is known per se from the technical literature for variable capacitances. The epitaxial layer which may be, for example, approximately 10 $\mu$m thick, may be provided on a substrate of the same conductivity type having a lower resistivity.

What is claimed is:

1. A controllable impedance attenuator, comprising:
   a layer of high-ohmic semiconductor material having a substantially flat major surface;
   first and second mutually spaced low-ohmic surface zones of one conductivity type nested in said layer and adjoining said major surface;
   a signal input connection contact attached at said major surface to said first surface zone;
   a signal output connection contact attached at said major surface to said second surface zone;
   a low-ohmic region of the opposite conductivity type nested in said layer, adjoining said major surface and spaced from both said first and said second surface zones;
   a signal current path extending within said layer from said first to said second surface zones, said signal current path substantially bypassing said region of opposite conductivity type but being adjacent thereto, said signal current path and first and second surface zones forming two diodes connected in series and opposition between said input and output contacts; and
   an electrically conductive connection contact attached at said major surface to said region of opposite conductivity type for controlling the impedance of said signal current path adjacent thereto.

2. A controllable impedance attenuator as defined in claim 1 wherein said layer extends from said major surface to an oppositely located surface which is parallel to said major surface and is free of any electrical connection contact.

3. A controllable impedance attenuator as defined in claim 1 wherein the resistivity of said high-ohmic layer is greater than 50 $\Omega$ cm.

4. A controllable impedance attenuator as defined in claim 1 wherein said surface zones are spaced by a portion of said high-ohmic layer and said region of opposite conductivity type is totally outside of said portion.

5. A controllable impedance attenuator as defined in claim 4 wherein said region of opposite conductivity type is a surface zone enclosing said surface zones of one conductivity type.

6. A controllable impedance attenuator as defined in claim 5 wherein said surface zones of one conductivity type are semicircular with the straight part thereof facing each other.

7. A controllable impedance attenuator as defined in claim 5 wherein the smallest distance between said surface zones is less than the smallest distance between said region of opposite conductivity and said surface zones.

8. A controllable impedance attenuator as defined in claim 1 wherein said signal input contact, said signal output contact and said electrically conductive connection contact each comprise a beam lead.

9. A controllable impedance attenuator, comprising:
- a layer of high-ohmic semiconductor material having a substantially flat major surface;
- first and second mutually spaced low-ohmic surface zones of one conductivity type nested in said layer and adjoining said major surface;
- a signal input connection contact attached at said major surface to said first surface zone;
- a signal output connection contact attached at said major surface to said second surface zone;
- a low-ohmic region of the opposite conductivity type nested in said layer, adjoining said major surface and spaced from both said first and said second surface zones;
- a signal current path extending within said layer from said first to said second surface zones, said signal current path substantially bypassing said region of opposite conductivity type but being adjacent thereto; and
- an electrically conductive connection contact attached at said major surface to said region of opposite conductivity type, said connection contact forming a common node for two diodes connected in series and opposition between said input and output contacts, said diodes comprising said first and second surface zones and said region of opposite conductivity type, said common node providing electrical access to said region of opposite conductivity type for controlling the impedance of said signal current path adjacent thereto.

10. A controllable impedance attenuator as defined in claim 9 wherein said layer extends from said major surface to an oppositely located surface which is parallel to said major surface and is free of any electrical connection contact.

11. A controllable impedance attentuator as defined in claim 9 wherein said surface zones are spaced by a portion of said high-ohmic layer and said region of opposite conductivity type is totally outside of said portion.

12. A controllable impedance attenuator as defined in claim 11 wherein said region of opposite conductivity type is a surface zone enclosing said surface zones of one conductivity type.

13. A controllable impedance attenuator as defined in claim 12 wherein said surface zones of one conductivity type are semicircular with the straight part thereof facing each other.

14. A controllable impedance attenuator as defined in claim 12 wherein the smallest distance between said surface zones is less than the smallest distance between said region of opposite conductivity and said surface zones.

* * * * *

UNITED STATES PATENT AND TRADEMARK OFFICE
CERTIFICATE OF CORRECTION

PATENT NO. : 4,143,383
DATED : March 6, 1979
INVENTOR(S) : KAREL P. VAN ROOIJ ET AL It is certified that error appears in the above-identified patent and that said Letters Patent are hereby corrected as shown below:

In the Heading add:

--[30]   Foreign Application Priority Data

Nov. 10, 1972 [NL]   Netherlands    7215200 --

Signed and Sealed this

Twenty-third Day of October 1979

[SEAL]

Attest:

RUTH C. MASON
*Attesting Officer*

LUTRELLE F. PARKER
*Acting Commissioner of Patents and Trademarks*